United States Patent [19]

Sakai

[11] Patent Number: 5,443,938
[45] Date of Patent: Aug. 22, 1995

[54] PHOTOSENSITIVE PRINTING MEMBER HAVING INK-RECEPTIVE CAPILLARY STRUCTURES IN THE SUPPORT AND PHOTOSENSITIVE LAYER

[75] Inventor: Jun Sakai, Nagoya, Japan

[73] Assignee: Brother Kogyo Kabushiki Kaisha, Nagoya, Japan

[21] Appl. No.: 125,790

[22] Filed: Sep. 24, 1993

[30] Foreign Application Priority Data

| Sep. 25, 1992 | [JP] | Japan | 4-256431 |
| Oct. 20, 1992 | [JP] | Japan | 4-281543 |
| Oct. 20, 1992 | [JP] | Japan | 4-281546 |
| Oct. 23, 1992 | [JP] | Japan | 4-285890 |

[51] Int. Cl.$^6$ .................... G03C 5/60; G03F 7/11
[52] U.S. Cl. .................... 430/162; 430/152; 430/155; 430/157; 430/167; 430/271; 430/273
[58] Field of Search ............... 430/155, 157, 162, 273, 430/270, 271, 152, 167

[56] References Cited

U.S. PATENT DOCUMENTS

| 4,339,520 | 7/1982 | Seibel et al. | 430/152 |
| 4,451,550 | 5/1984 | Bennett et al. | 430/152 |
| 4,515,885 | 5/1985 | Gatzke et al. | 430/152 |
| 4,755,445 | 7/1988 | Hasegawa | 430/272 |
| 4,999,273 | 3/1991 | Hasegawa | 430/271 |

FOREIGN PATENT DOCUMENTS 1-202486  8/1989  Japan .

*Primary Examiner*—Charles L. Bowers, Jr.
*Assistant Examiner*—Christopher G. Young
*Attorney, Agent, or Firm*—Oliff & Berridge

[57] ABSTRACT

A photosensitive printing member comprises a porous supporting member and a photosensitive layer formed on the porous supporting member. The photosensitive layer comprises a photosensitive material and a foaming material or filler melted or dispersed in the photosensitive material. A porous stamp plate can be formed with fewer process steps than the conventional method and without using a mold. As a result, a small number of photosensitive printing members can be used to produce various models of stamps.

13 Claims, 11 Drawing Sheets

PHOTOSENSITIVE PRINTING MEMBER HAVING INK-RECEPTIVE CAPILLARY STRUCTURES IN THE SUPPORT AND PHOTOSENSITIVE LAYER

BACKGROUND OF THE INVENTION

1. Field of the Invention

The present invention relates to a photosensitive printing member, and to an ink stamp plate using the photosensitive printing member.

2. Description of Related Art

A porous supporting member used for stamps has been formed by a method described as follows. First, a block copy is made and a silk screen for printing is made based on the block copy. Next, an aluminum board where resist ink is printed using the silk screen is heated, and a pattern is printed out on the aluminum board. Next, after the resist ink is removed by etching the aluminum board where the pattern is printed out, a matrix having an uneven pattern is obtained. The uneven pattern of the matrix is transferred onto a thermoplastic resin board with heat to obtain a rubber mold.

Rubber mixed with salt is put in the rubber mold and the rubber is pressurized and heated. After salt is removed from the molded rubber and the rubber is dried, a porous printing member is obtained. Because ink infiltrates into the porous printing member, an image can be transferred onto a recording medium a number of times without using any vermilion inkpad or stamp pad.

This kind of porous printing member has been disclosed in Japanese Unexamined Patent Publication No. 1-202486.

However, the above-described process is very complicated and expensive because one mold has to be formed for every image. Therefore, it is difficult to use a small number of printing members to produce various models of stamps.

SUMMARY OF THE INVENTION

The present invention provides a photosensitive printing medium formed using a simple manufacturing process without using any molds.

A photosensitive printing member of the present invention comprises a supporting member and a photosensitive layer provided on the supporting member. The photosensitive layer includes a photosensitive material and a foaming material or a filling material.

In operation of the photosensitive printing member of the present invention, if the photosensitive printing member is exposed to light, the foaming material or filling material generates minute holes in the photosensitive layer.

A stamp plate can be formed with few process steps and no mold using a photosensitive printing member of the present invention. As a result, it becomes easy to use a small number of photosensitive printing members to produce various models of stamps.

BRIEF DESCRIPTION OF THE DRAWINGS

Preferred embodiments of the present invention will be described in detail with reference to the following figures wherein.

DETAILED DESCRIPTION OF THE PREFERRED EMBODIMENTS

Figure 1A:
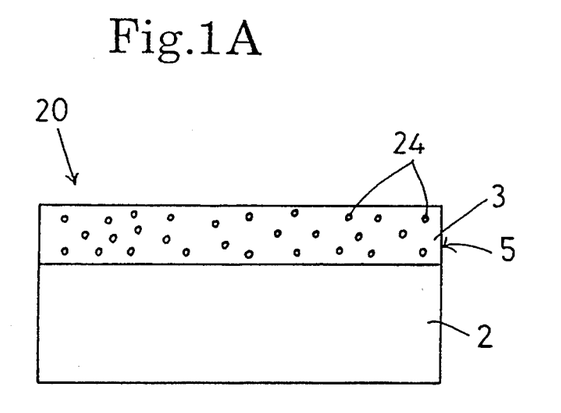
FIG. 1A is a sectional view showing the structure of the photosensitive printing member of the first embodiment.

Hereafter, the first embodiment of the present invention will be explained by referring to FIG. 1A through FIG. 5. As shown in FIG. 1A, a photosensitive printing member 20 comprises a porous supporting member 2 and a photosensitive layer 5 which is formed on the porous supporting member 2. The photosensitive layer 5 includes a photosensitive material 3 and a foaming material 24 melted or dispersed in the photosensitive material 3.

The porous supporting member 2 has minute holes of a capillary shape and ink infiltrates into the minute holes. For example, the following materials can be used as the porous supporting member 2: weaved cloths, unweaved cloths, paper extended resin films having small holes, foams of polyurethane, polyvinyl chloride or polypropylene resins and sintered fine powders of metals, metal oxides, metal nitrides, metal carbides, or thermo-hardening resins.

Suitable materials for use as the photosensitive material 3 include, for example, light dimerization resins having a photosensitive group of cinnamic acid residue, cinnamylidene residue, coumalin residue or stilbene residue, light decomposition resins having a photosensitive group of diazonium salt residue, quinonediazide residue, azide residue, dithiocarbamate residue, benzoin residue, and photopolymerizable resins having an acryloyl group, allyl group, vinyl group, epoxy group, acrylamide group, or unsaturated polyester group. The most preferred material for the photosensitive material 3 is a photopolymerizable resin. The photosensitive material 3 is used in the form of a liquid or wax.

Binders can be added to the photosensitive material 3. Polymers can be used as the binder. It is preferable to use acrylic resins, olefinic resins, vinylacetate resins, vinylchloride resins, styrene resins, polyamide resins, polyester resins, rubber resins, silicone resins, fluororesins, petroleum resins or rosin. Wax can be used as the binder.

Photopolymerization initiators, photosensitizers, stabilizers, modifiers and diluents can be added to the photosensitive material 3. The photopolymerization initiator polymerizes photosensitive materials. Generally known compounds such as benzoinalkylether, benzophenone, Michler's ketone, thioxanthone and acetophenone can be used as the photopolymerization initiator.

The photosensitizer extends the area of wave lengths to which the photosensitive material is sensitive. Anthraquinone or 5-nitrofluorenone can be used as the photosensitizer. The stabilizer, modifier and diluent are effective in preserving the photosensitive material. Heat polymerization inhibitors can be used for the stabilizer. Oligomers or monomers of low molecular weight can be used for the diluent.

Materials which generate gas when heated (at 50° C. or more for example) or materials which generate gas when exposed to light can be used as the foaming material 24. Foaming materials which generate gas when heated and foaming materials which generate gas when exposed to light can be used independently or in combination. The ratio by weight of the amount of photosensitive material to the amount of foaming material is preferably from about 1000:1 to about 10:1.

Nitroso compounds, sulfohydrazide compounds, hydrazo compounds, and azo compounds are suitable materials which generate gas when heated.

Dinitrosopentamethylenetetramine, N,N-dimethyl-N,N-dinitrosoterephthalamide and trinitroso trimethylene triamine are useful nitroso compounds. P-toluenesulfohydrazide, benzensulfohydrazide, p,p-oxibis(benzensulfohydrazide), benzen-1,3-disulfohydrazide, 3,3-disulfohydrazidephenylsulfone, toluene-2,4-disulfohydrazide and p,p-thiobis(benzensulfohydrazide) are useful sulfohydrazide compounds.

Hydrazodicarboamide, N,N-dibenzoylhydrazine, β-acethylphenylhydrazine and 1,1-diphenylhydrazine are useful hydrazo compounds.

Azobis isobutyronitrile, azobis formamide, diazo aminobenzene and azocarboxylic acid diethyleseter are useful azo compounds.

The nitroso compounds, sulfohydrazide compounds, hydrazo compounds, and azo compounds generate nitrogen gas when heated.

Diazonium compounds, azide compounds, diazide compounds, and dicarboxylic acids can be used as materials which generate gas when exposed to light.

Suitable diazonium compounds include, for example, 2,5-diethoxy-benzenediazonium chloride, p-dimethyl amino-benzenediazonium chloride, p-diethyl amino-benzenediazonium chloride, 2,5-dichloro-4-benzil amino-benzenediazonium chloride, 2,5-butoxy-4-morpholino-benzenediazonium chloride and 4-phenyl amino-benzenediazonium chloride. These compounds generate nitrogen gas when exposed to light.

4-4'-diazide-stilbene-2-2'-disulfonic acid, sodium salts of 4-4'-diazide-stilbene-2-2'-disulfonic acid, 4,4'-diazide chalcone and 2-azide-1,4-naphthalene-diabenzene-sulfone amide are useful azide compounds.

2-diazo 1-naphthol-5-sulfoneacid ethylether is a useful diazide compound. The above-mentioned azide compounds and diazide compounds generate nitrogen gas when exposed to light.

Iron (III) oxalate and iron (III) ammonium oxalate are useful dicarboxylic acids. These compounds decompose upon exposure to light and generate carbon dioxide.

Figure 1B:
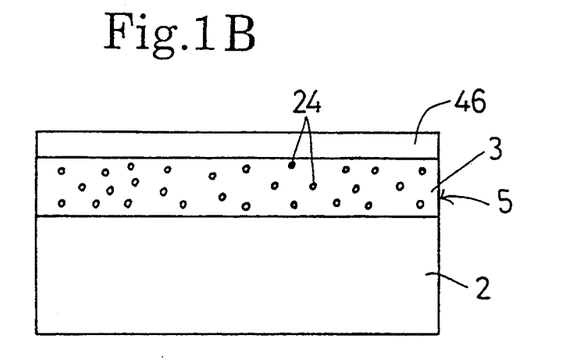
FIG. 1B is a sectional view showing the structure of the photosensitive printing member of the first embodiment with a protection layer.

As shown in FIG. 1B, a protection layer 46 can be formed on the photosensitive layer 5. Polymer films, metallic foil, paper and paper laminated by resin materials can be used as the protection layer 46. Examples of useful polymer films include polypropylenes, polyesters, polystyrenes, polycarbonates, ionomers, nylons, polyvinyl alcohols, polyvinyl chlorides, polyvinylidene chlorides, polyphenylene sulfides, polymethylpentenes, acetylcelluloses, cellulose esters, polyvinyl acetals, fluororesins and cellophanes. A thin layer of materials of poor wettability such as silicone resin or fluororesin can be formed on one side or both sides of the protection layer 46.

Figure 2:
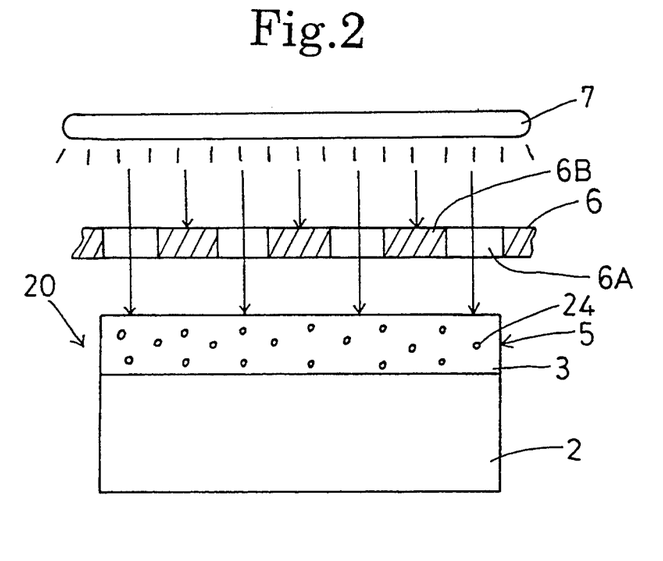
FIG. 2 is a sectional view showing the exposure of the photosensitive printing member of the first embodiment.

Next, a plate-making method used with the above-explained photosensitive printing member 20 will be explained. First, the protection layer 46 is removed from the photosensitive layer 5. An original 6 of the light penetration type is overlapped with the photosensitive printing member 20 and is exposed to light using a lamp 7 as shown in FIG. 2. Since light from the lamp 7 penetrates the original 6 through transparent parts 6A of the original 6, those portions of photosensitive layer 5 of the photosensitive printing member 20 corresponding to the transparent parts 6A are exposed.

Figure 3:
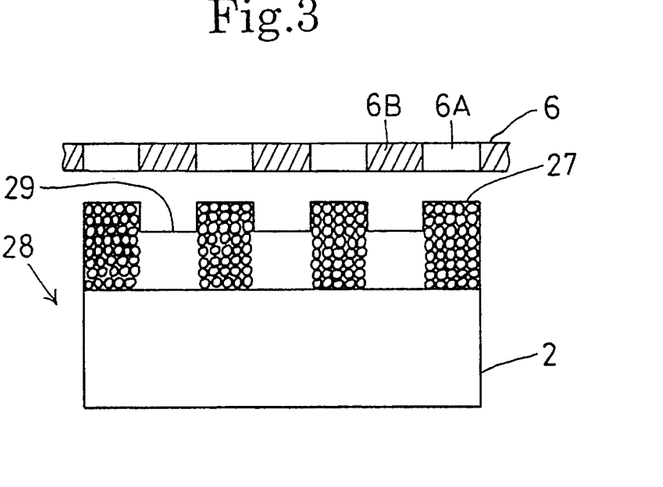
FIG. 3 is a sectional view showing the photosensitive printing member of the first embodiment after exposure.

In the exposed portions of photosensitive layer 5, the hardness of the photosensitive material 3 becomes high because of a photo-hardening reaction. At the same time, since the foaming material 24 generates gas, the shape of the exposed portions of photosensitive layer 5 changes to form hardened foam parts 27 having a continuous capillary structure (FIG. 3).

On the other hand, the shape of other areas of the photosensitive layer 5 does not change because neither the photo-hardening reaction nor the generation of gas occurs in those portions of the photosensitive layer 5 corresponding to the opaque parts 6B of the original 6.

Therefore, if an original 6 of a light penetration type having a negative image of a desired stamp plate is overlapped with the photosensitive printing member 20 and exposed to light, a stamp plate 28 is obtained in which those portions of the photosensitive layer 5 corresponding to the printed parts become hardened foam parts 27.

Figure 4:
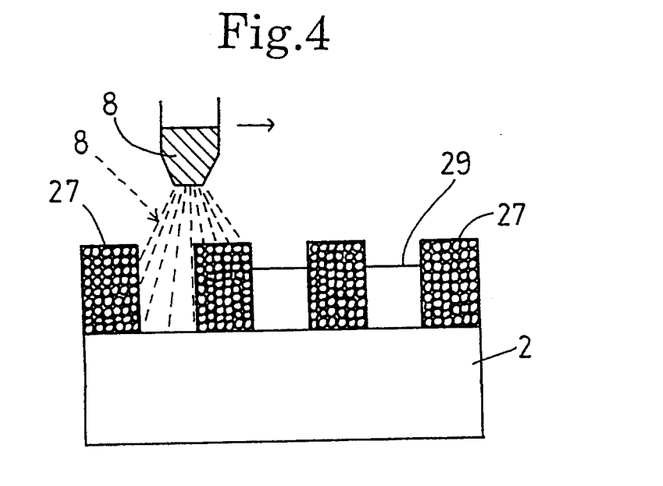
FIG. 4 is a sectional view showing a process of cleaning the photosensitive layer of the photosensitive printing member of the first embodiment with a solvent.
Figure 5:
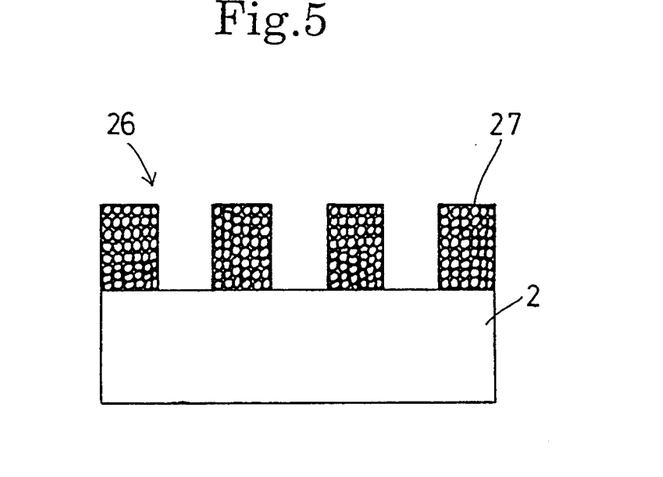
FIG. 5 is a sectional view showing the surface of a stamp plate acording to the invention.

After exposure to light, the surface of the photosensitive layer 5 is cleaned by a predetermined solvent such as alkaline water, alcohol, ketone or ester. During this cleaning process the hardened foam parts 27 of photosensitive layer 5 are not dissolved by the solvent 8 because the photosensitive layer 5 of hardened foam parts 27 has been hardened by the exposure to light. However, since the unexposed photosensitive layer 29 is not hardened, the unexposed photosensitive layer 29 is dissolved and removed by the solvent 8, as shown in FIG. 4. As a result, a stamp plate 26 having hardened foam parts 27 with a capillary structure is formed, as shown in FIG. 5.

Figure 6:
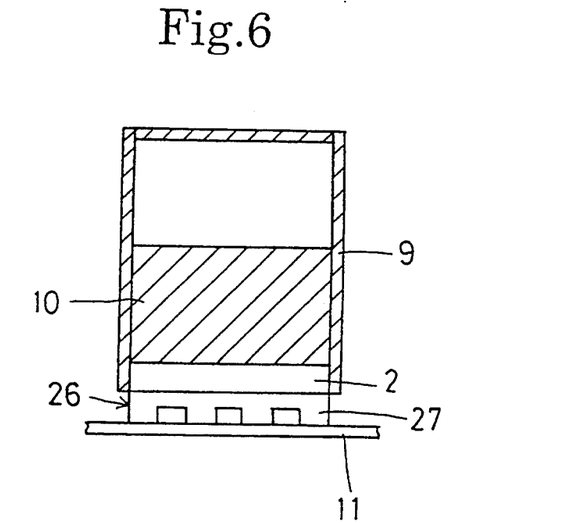
FIG. 6 is a sectional view showing the stamp plate set in a stamp plate holding unit.

The stamp plate 26 is set in a stamp plate holding unit 9 as shown in FIG. 6 and ink 10 is put in the stamp plate holding unit 9. Ink 10 infiltrates into the continuous capillary structure formed in the hardened foam parts 27 of the stamp plate 26. If the hardened foam parts 27 of the stamp plate are overlapped with a printing medium 11 and pressurized, ink infiltrated into the hardened foam parts 27 is transferred onto the printing medium 11.

The stamp plate 26 set in the stamp plate holding unit 9 as shown in FIG. 6 can be used to form an image on the printing medium 11 without a cleaning process.

As is clear from the above explanation, with a photosensitive printing member 20 of the first embodiment, a porous stamp plate can be formed with fewer process steps than the conventional method and without using a mold. As a result, a small number of photosensitive printing members can be used to produce various stamp models. Moreover, since the protection layer 46 is formed on the photosensitive layer 5, the surface of the photosensitive layer 5 is not damaged when the photosensitive printing member 20 is in use or not in use.

Figure 7:
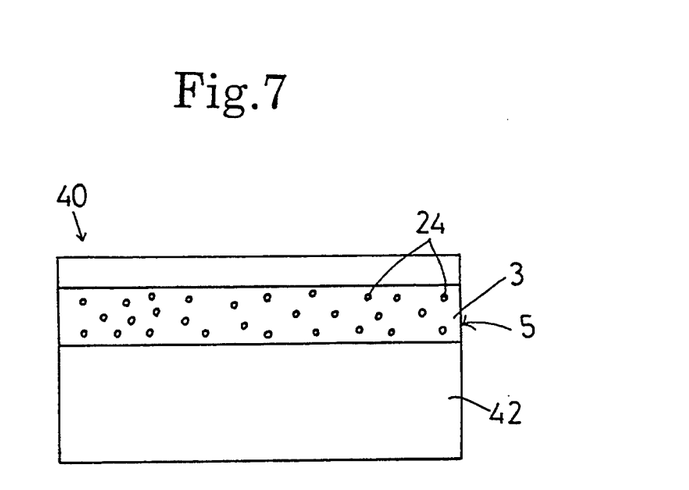
FIG. 7 is a sectional view showing the structure of a sheet for forming a printing member of the second embodiment.

Next, a second embodiment of the invention will be explained by referring to FIGS. 7 through FIG. 15. As shown in FIG. 7, a sheet for forming photosensitive printing member 40 comprises a supporting member 42 and a photosensitive layer 5 formed on the supporting member 42. The photosensitive layer 5 comprises photosensitive material 3 and foaming material 24 melted or dispersed in the photosensitive material 3. A protection layer 46 can be formed on the photosensitive layer 5.

Film shaped materials with high transparency is preferred for the supporting member 42. Polymer films and thin glass layers can be used as the supporting member 42. Examples of polymer films are polypropylenes, polyesters, polystyrenes, polycarbonates, ionomers, nylons, polyvinyl alcohols, polyvinyl chlorides, polyvinylidene chlorides, polyphenylene sulfides, polymethylpentenes, acetylcelluloses, cellulose esters, polyvinyl acetals, fluororesins and cellophanes.

The same materials as described in the first embodiment can be used as the photosensitive material 3. Binders can be added to the photosensitive material 3 as described in the first embodiment. The same materials as described in the first embodiment can be used as the binder. The same materials for the photopolymerization initiator, photosensitizer, stabilizer, modifier and diluent as described in the first embodiment can be added to the photosensitive material.

Materials which generate gas when heated (at 50° C. or more for example) or materials which generate gas when exposed to light can be used as the foaming material 24. The same materials as described in the first embodiment are useful as foaming materials which generate gas when heated or exposed to light. The ratio by weight of photosensitive material to foaming material is again preferably in the range of from about 1000:1 to about 10:1.

The same materials as described in the first embodiment can be used as the protection layer 46. A thin layer of materials of poor wettability such as silicone resin or fluororesin can be formed on one side or both sides of the protection layer 46.

Figure 8:
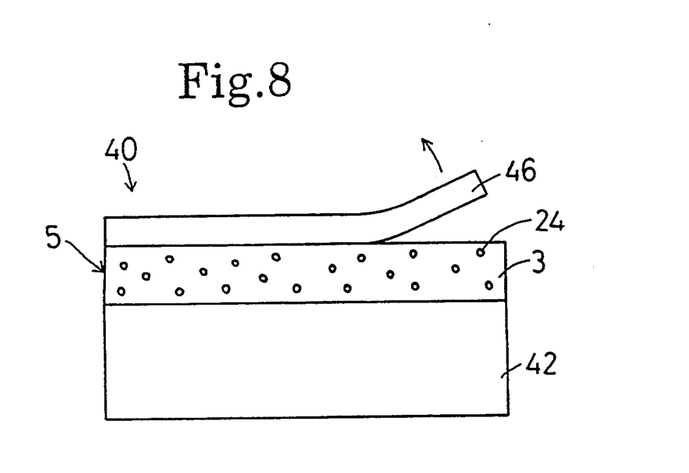
FIG. 8 is a sectional view showing a protection layer being removed from the sheet to form a printing member.
Figure 9:
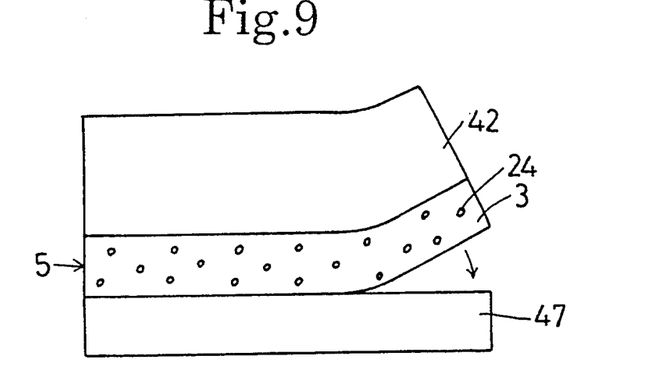
FIG. 9 is a sectional view showing that the sheet for forming a printing member of the second embodiment is fixed on a porous substrate.

The method of forming a stamp plate using a sheet for forming a photosensitive printing member 40 is explained by referring to FIG. 8 through FIG. 14. First, the protection layer 46 is removed from the sheet 40, as shown in FIG. 8. Since the surface of the protection layer 46 has poor wettability, the protection layer 46 is easy to remove from the photosensitive layer 5. Next, as shown in FIG. 9, the photosensitive layer 5 with the supporting member 42 is overlapped with a porous substrate 47 and pressurized to fix photosensitive layer 5 to substrate 7. Since the photosensitive layer 5 is adhesive, the layer 5 can be fixed on the porous substrate 47.

The same materials as described in the first embodiment for the porous supporting member 2 can be used as the materials for the porous substrate 47.

Figure 10:
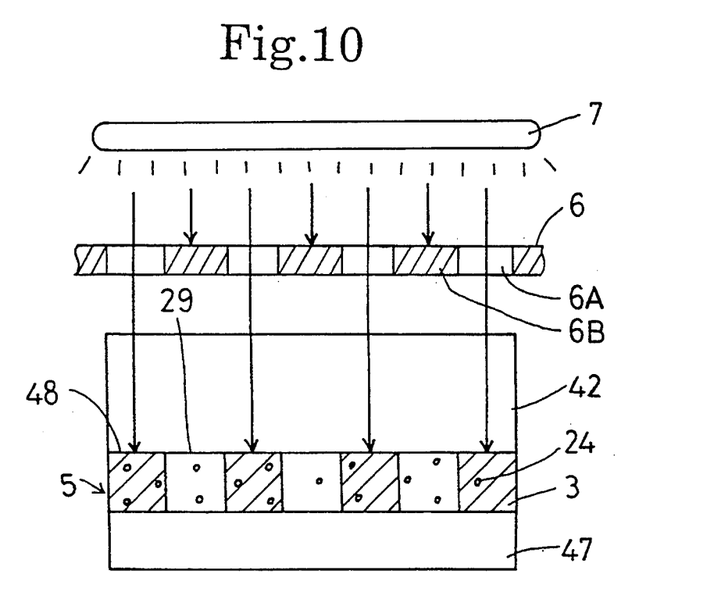
FIG. 10 is a sectional view showing the exposure of the sheet for forming a printing member of the second embodiment fixed on a porous supporting member.
Figure 11:
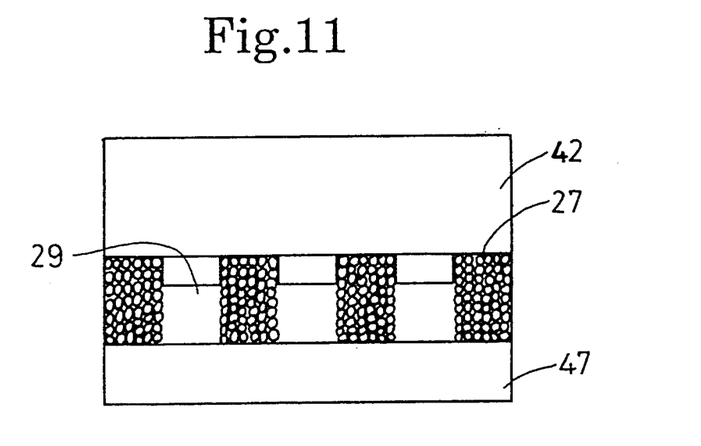
FIG. 11 is a sectional view showing the sheet for forming a printing member of the second embodiment after exposure.

Referring to FIG. 10 after an original 6 of a light penetration type is overlapped with the supporting member 42, the original 6 and the sheet are exposed from the supporting medium 42 side by the lamp 7. Light from the lamp 7 penetrates the transparent parts 6A of the original 6 and those portions of photosensitive layer 5 corresponding to the transparent parts 6A are exposed. In the exposed photosensitive layer 48, the hardness of the photosensitive material 3 becomes high because of a photo-hardening reaction. At the same time, since the foaming material 24 generates gas, the shape of the exposed photosensitive layer 48 changes to form hardened foam parts 27 having a continuous capillary structure, as shown in FIG. 11.

On the other hand, the shape of other areas of the photosensitive layer 5 does not change because neither the photo-hardening reaction nor the generation of gas occurs in those portions of photosensitive layer 5 corresponding to the opaque parts 6B of the original 6.

Figure 12:
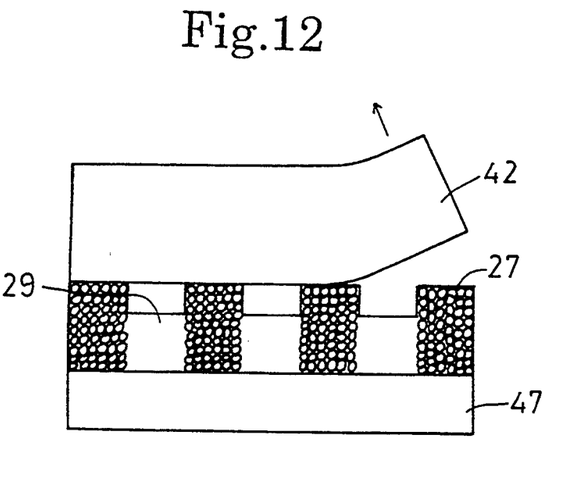
FIG. 12 is a sectional view showing a process of removing the supporting member.
Figure 13:
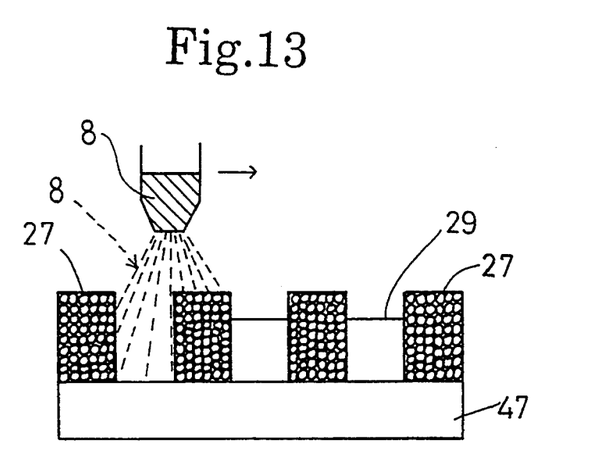
FIG. 13 is a sectional view showing the cleaning of the photosensitive layer using a solvent.
Figure 14:
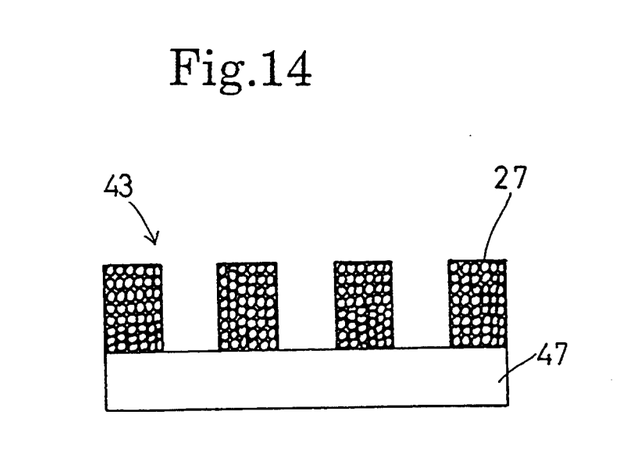
FIG. 14 is a sectional view showing a surface of a stamp plate according to the invention.

After exposure to light, the supporting member 42 is removed as shown in FIG. 12, and the surface of the photosensitive layer 5 is cleaned by a predetermined solvent 8 such as alkaline water, alcohol, ketone or ester (FIG. 13). During this cleaning process, the hardened foam parts 27 of the photosensitive layer 5 are not dissolved by the solvent 8 because the photosensitive layer 5 of hardened foam parts 27 has been hardened by the exposure to light. However, since the unexposed photosensitive layer 29 is not hardened, the unexposed photosensitive layer 29 is dissolved and removed by the solvent 8. As a result, a stamp plate 43 having hardened foam parts 27 with a capillary structure is formed, as shown in FIG. 14.

Figure 15:
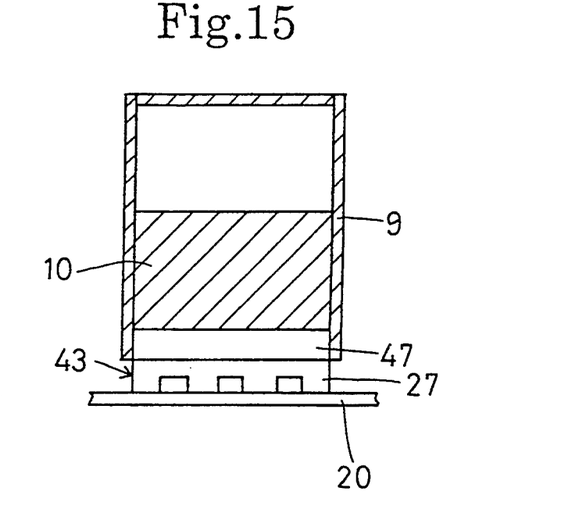
FIG. 15 is a sectional view showing the stamp plate set in a stamp plate holding unit.

The stamp plate 43 is set in a stamp plate holding unit 9 as shown in FIG. 15. Ink 10 is put in the stamp plate holding unit 9. Ink 10 infiltrates into the continuous capillary structure formed in the hardened foam parts 27 of the stamp plate 43. If the hardened foam parts 27 of the stamp plate 43 are overlapped with a printing medium 20 and pressurized, ink infiltrated into the hardened foam parts 27 is transferred onto the printing medium 20.

The stamp plate can be formed without a cleaning process. Supporting member 42 can be removed from the photosensitive layer 5 before exposure to light and the original 6 can be overlapped with the photosensitive layer 5 and exposed after the removal of the supporting member 42. A thin layer of materials of poor wettability such as silicone resin or fluororesin can be formed on one side or both sides of the supporting member 42.

Using a sheet 40 of the second embodiment, a porous stamp plate can be formed with fewer process steps than the conventional method and without using a mold. As a result, a small number of photosensitive printing members can be used to easily produce various models of stamps. Moreover, since the protection layer 46 is formed on the photosensitive layer 5, the surface of the photosensitive layer 5 is not damaged when the sheet 40 is in use or not in use.

Figure 16:
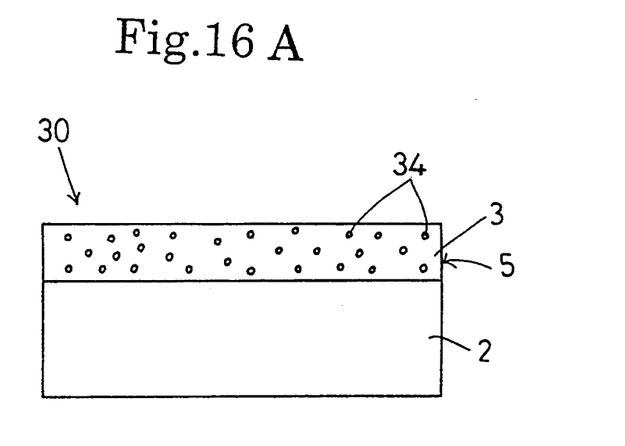
FIG. 16A is a sectional view showing the structure of the photosensitive printing member of the third embodiment.
FIG. 16B is a sectional view showing the structure of the photosensitive printing member of the third embodiment with a protection layer.

Next, a third embodiment of the invention will be explained referring to FIG. 16A through FIG. 21. FIG. 16A is an expanded sectional view showing the structure of a photosensitive printing member 30 of the third embodiment. As shown in FIG. 16A, a photosensitive printing member 30 comprises a porous supporting member 2 and a photosensitive layer 5 formed on the supporting member 2. The photosensitive layer 5 comprises photosensitive material 3 and filler 34 dispersed in the photosensitive material 3. As shown in FIG. 16B, a protection layer 46 can be formed on the photosensitive layer 5.

Figure 17:
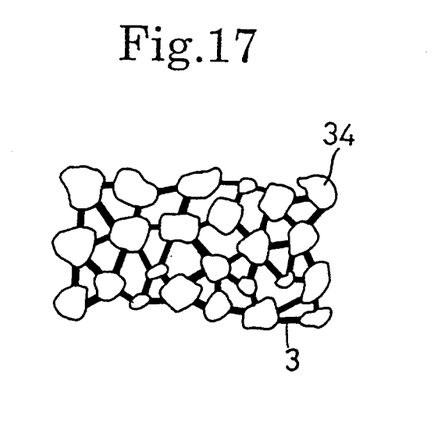
FIG. 17 is an expanded view of the minute structure of the photosensitive layer.

FIG. 17 shows a minute structure of the photosensitive layer 5. Particles of the filler 34 are joined to each other by the photosensitive material 3, which has a string-like shape. Continuous minute holes are formed between filler particles 34.

Because porous supporting member 2 has continuous minute holes of a capillary shape therein, ink can infiltrate into the minute holes. The same materials for the porous supporting member 2 described in the first embodiment can be used as the porous supporting member 2.

The same materials for the photosensitive material 3 described in the first embodiment can be used as the photosensitive material 3.

Binders can be added to the photosensitive material 3. The same binder materials described in the first embodiment can be used.

The photopolymerization initiator, photosensitizer, stabilizer, modifier and diluent can be added to the photosensitive material as described in the first embodiment.

Particles of inorganic compounds or organic compounds can be used as the filler 34. Metals, metal oxides, metal nitrides and metal carbides are examples of useful inorganic compounds. Polymers and waxes are examples of useful organic compounds. Examples of polymers include acrylic resins, olefinic resins, vinylacetate resins, vinylchloride resins, styrene resins, polyamide resins, polyester resins, rubbers, silicone resins, fluororesins, petroleum resins, and rosin. The ratio by weight of the amount of photosensitive material to the amount of filler is preferably in the range of from about 1:100 to about 1:1.

The same materials as described in the first embodiment can be used as the protection layer 46. A thin layer of materials of poor wettability such as silicone resin or fluororesin can be formed on one side or both sides of the protection layer 46.

Figure 18:
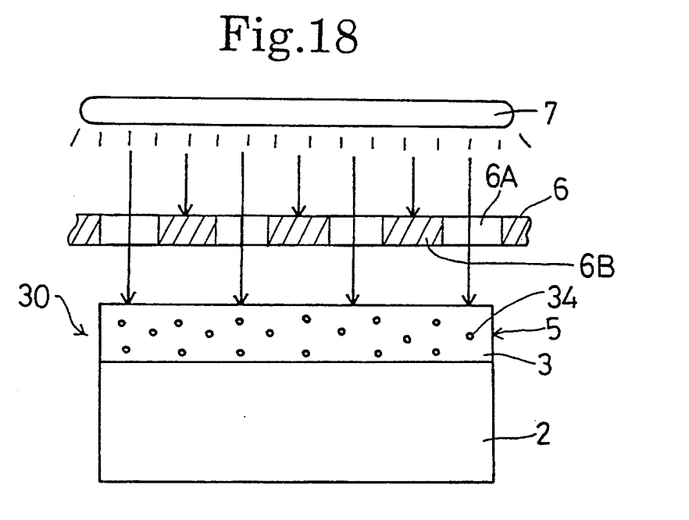
FIG. 18 is a sectional view showing the exposure of the photosensitive printing member of the third embodiment.

Next, a method of forming a stamp plate using the photosensitive printing member 30 of the third embodiment will be explained. An original 6 of a light penetration type is overlapped with the photosensitive printing member 30 and is exposed to light by the lamp 7 as shown in FIG. 18. Since light from lamp 7 penetrates the original 6 through transparent parts 6A of the original 6, those portions of photosensitive layer 5 of the photosensitive printing member 30 corresponding to the transparent parts 6A are exposed.

In the exposed portions of photosensitive layer 5, since the hardness of the photosensitive material 3 becomes high because of a photo-hardening reaction, the connecting force between filler particles 34 becomes strong and the exposed photosensitive layer is not dissolved by a predetermined solvent 8 such as alkaline water, alcohol, ketone or esters. On the other hand, those portions of photosensitive layer 5 corresponding to the opaque parts 6B are not photo-hardened; thus, the connecting force between the filler particles 34 in these areas does not become strong and the unexposed portions of photosensitive layer 5 are easily dissolved by the predetermined solvent 8.

Figure 19:
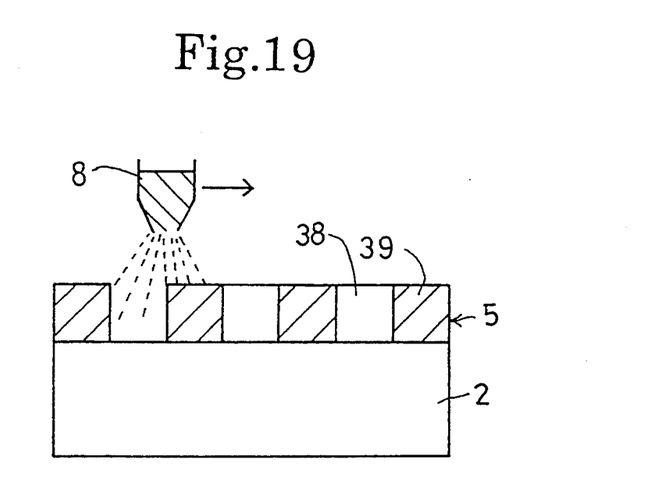
FIG. 19 is a sectional view showing the cleaning of the photosensitive printing member of the third embodiment using a solvent.
Figure 20:
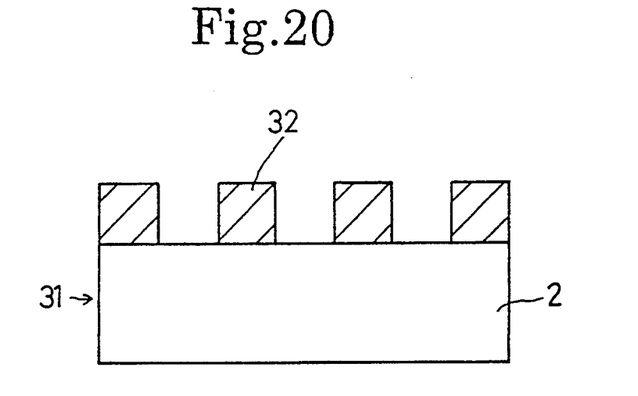
FIG. 20 is a sectional view showing a surface of the photosensitive printing member.

As shown in FIG. 19, the surface of the photosensitive layer 5 is cleaned by the predetermined solvent 8 after the exposure to light. During the cleaning process, the exposed portion of photosensitive layer 5 are not dissolved by the solvent 8 because the exposed portions of photosensitive layer 5 are hardened by the exposure to the light. However, since the unexposed photosensitive layer 39 is not hardened, the unexposed photosensitive layer 39 is dissolved and removed by the solvent 8. As a result, printing parts 32 are formed on the photosensitive printing member 30 as shown in FIG. 20.

As described above, after the original 6 of a light penetration type having a negative image of a desired stamp plate is overlapped with the photosensitive printing member and exposed to light, a stamp plate 31 is obtained in which the printing parts 32 have minute holes.

Figure 21:
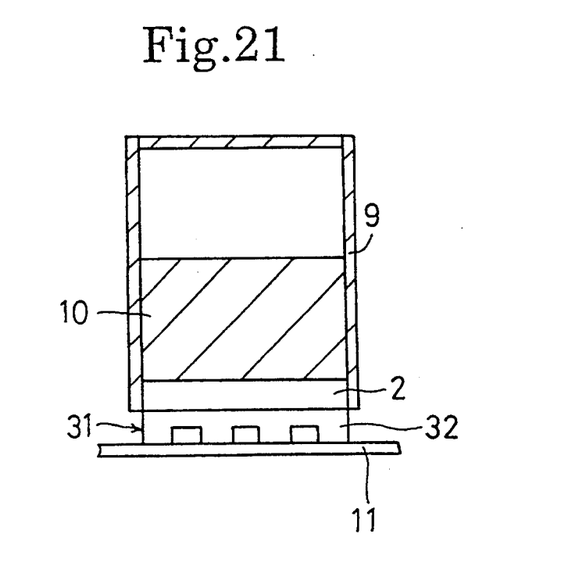
FIG. 21 is a sectional view showing a stamp plate set in a stamp plate holding unit.

The stamp plate 31 is set in a stamp plate holding unit 9 as shown in FIG. 21, and ink 10 is put in the stamp plate holding unit 9. Ink 10 infiltrates into the continuous capillary structure formed in the printing parts 32 of the stamp plate 31. If the printing parts 32 of the stamp plate 31 are overlapped with a printing medium 11 and pressurized, ink infiltrated into the convex printing parts 32 is transferred onto the printing medium 11.

Photo-softening materials which increase the solubility of the exposed parts can be used instead of photo-hardening materials. Examples of photo-softening materials include 3-oxyamino-1-butanone-methacrylate, poly-4'-alkyl acylophenon, polymethyl methacrylate, methyl methacrylate, 3-methacryloxyimino-2-butanone copolymer, copolymer of methyl methacrylate and indanone, polyglutarimide, polyolofine sulfone, polymethyl isopropenyl ketone, polymethyl vinyl ketone, polyvinyl phenyl ketone, polysulfone and copolymer of ethylene and carbon monoxide.

Using a photosensitive printing member 30 of the third embodiment, a porous stamp plate can be formed with fewer process steps than the conventional method and without using a mold. As a result, a small number of photosensitive printing members can be used to easily produce various models of stamps.

Figure 22:
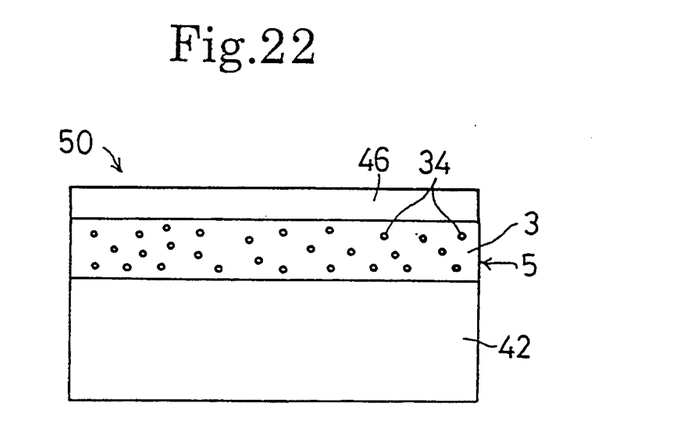
FIG. 22 is a sectional view showing the structure of the sheet for forming a printing member of the fourth embodiment.

A fourth embodiment of the invention will be explained by referring to FIG. 22 through FIG. 30. FIG. 22 is an expanded sectional view showing the structure of a sheet for forming a photosensitive printing medium 50 of the fourth embodiment. As shown in FIG. 22, a sheet for forming a photosensitive printing member 50 comprises a supporting member 42 and a photosensitive layer 5 formed on the supporting member 42. The photosensitive layer 5 comprises photosensitive material 3 and filler 34 dispersed in the photosensitive material 3. A protection layer 46 can be formed on the photosensitive layer 5.

Figure 23:
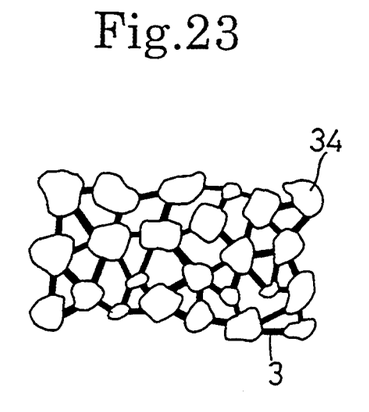
FIG. 23 is a sectional view showing the minute structure of the photosensitive layer.

FIG. 23 shows a minute structure of the photosensitive layer 5. Particles of filler 34 are joined to each other by the photosensitive material 3, which has a string-like shape. Continuous minute holes are formed between filler particles 34.

Film-shaped materials of high transparency are preferred for the supporting member 42, and the same materials as described in the second embodiment can be used as the supporting member 42. The same materials as described in the first embodiment can be used as the photosensitive material 3.

Binders can be added to the photosensitive material 3. The same materials as described in the first embodiment can be used as the binder. The photopolymerization initiator, photosensitizer, stabilizer, modifier and diluent can be added to the photosensitive material 3 as described in the first embodiment.

The same materials as described in the third embodiment can be used as the filler 34. The ratio by weight of the amount of photosensitive material to the amount of filler is again preferably in the range of from about 1:100 to about 1:1.

The same materials as described in the second embodiment can be used as the protection layer 46. A thin layer of materials of poor wettability such as silicone resin or fluororesin can be formed on one side or both sides of the protection layer 46.

Figure 24:
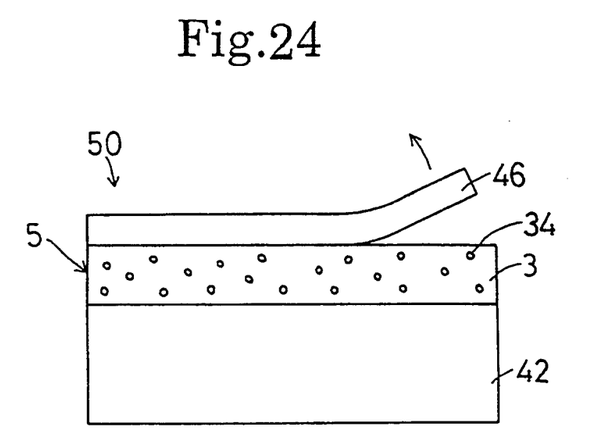
FIG. 24 is a sectional view showing that the protection layer is removed from the sheet to form a printing member.

Next, a method of forming a stamp plate using the sheet for forming a photosensitive printing member 50 of the fourth embodiment will be explained. First, the protection layer 46 is removed from the sheet 50, as shown in FIG. 24. Since the surface of the protection layer 46 has poor wettability, the protection layer 46 is easy to remove from the photosensitive layer 5.

Figure 25:
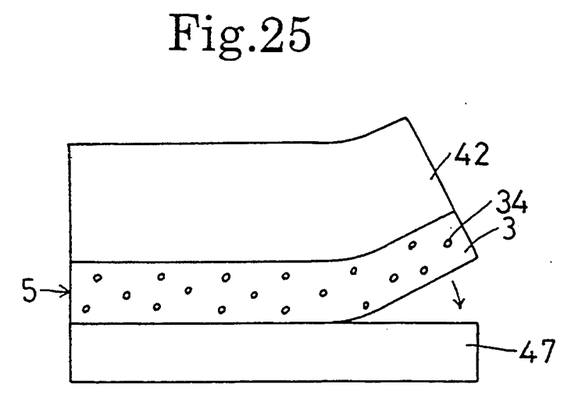
FIG. 25 is a sectional view showing that the sheet for forming a printing member is fixed on the porous substrate.

Next, as shown in FIG. 25, the photosensitive layer 5 with the supporting member 42 is overlapped with the porous substrate 47 and pressurized to fix photosensitive layer 5 to substrate 47. The same materials as described in the first embodiment for the porous supporting member 2 can be used as the porous substrate 47. Since the photosensitive layer 5 is adhesive, the layer 5 can be fixed on the porous substrate 47.

Figure 26:
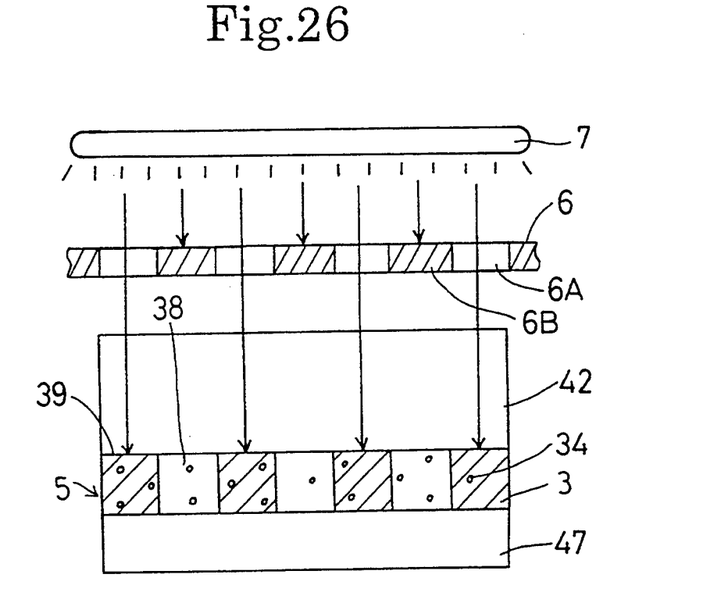
FIG. 26 is a sectional view showing the exposure of the sheet for forming the printing member fixed on the porous substrate.

An original 6 of a light penetration type is overlapped with the supporting member 42 and is exposed to light from a lamp 7 as shown in FIG. 26. Since light from the lamp 7 penetrates the original 6 through transparent parts 6A of the original 6, portions of photosensitive layer 5 are exposed to the light. In the exposed portions of photosensitive layer 5, since the hardness of the photosensitive material 3 becomes high because of a photohardening reaction, the connecting force between filler particles 34 becomes strong and the exposed portions of photosensitive layer 5 are not dissolved by a predetermined solvent 8 such as alkaline water, alcohol, ketone or esters.

On the other hand, those portions of photosensitive layer 5 corresponding to the opaque parts 6B are not photo-hardened; thus, the connecting force between the filler particles 34 does not become strong and the unexposed portions of photosensitive layer 5 are easily dissolved by the predetermined solvent 8.

Figure 27:
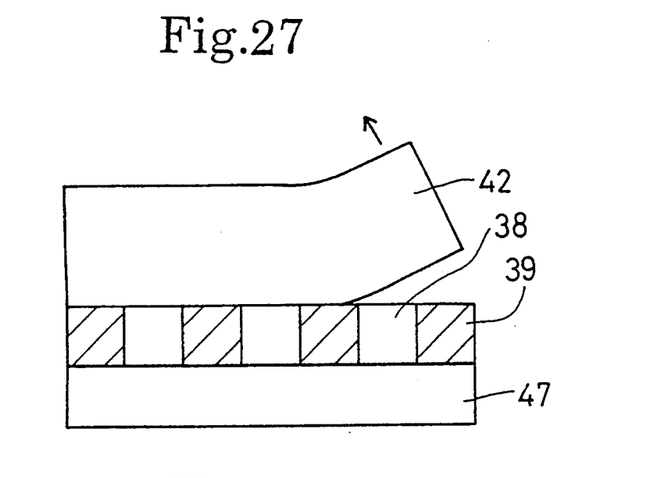
FIG. 27 is a sectional view showing that the supporting member is removed.
Figure 28:
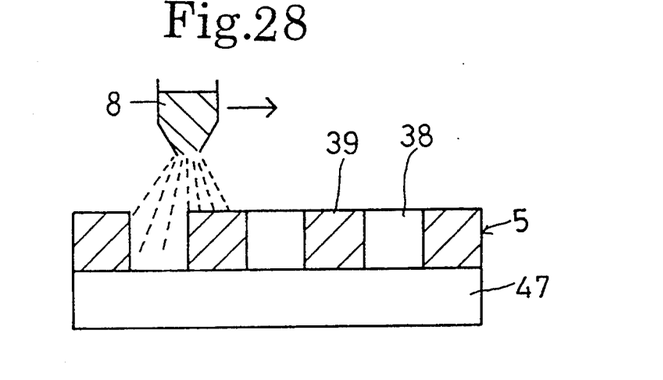
FIG. 28 is a sectional view showing the cleaning of the photosensitive layer using a solvent.
Figure 29:
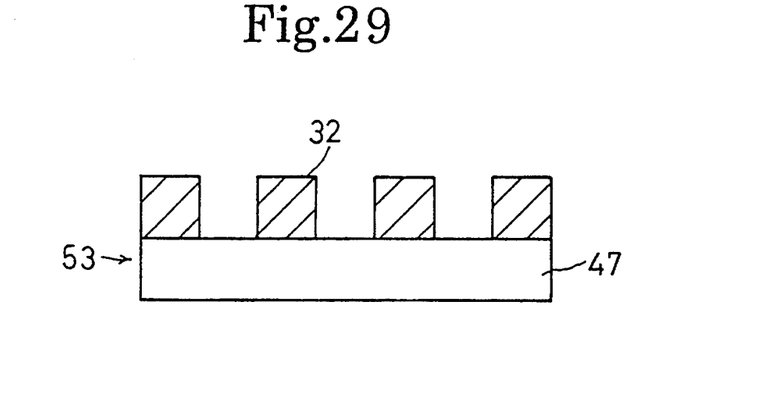
FIG. 29 is a sectional view showing the surface of a stamp plate according to the invention.

After exposure to light, the supporting member 42 is removed as shown in FIG. 27 and the surface of the photosensitive layer 5 is cleaned by the predetermined solvent 8 as shown in FIG. 28. During the cleaning process, the exposed portions of photosensitive layer 5 are not dissolved by the solvent 8 because the exposed portions of photosensitive layer 5 have been hardened by the exposure to light. However, since the unexposed photosensitive layer 38 is not hardened, the unexposed photosensitive layer 38 is dissolved and removed by the solvent 8. As a result, a stamp plate 53 having printing parts 32 of a capillary structure as shown in FIG. 29 is obtained.

Figure 30:
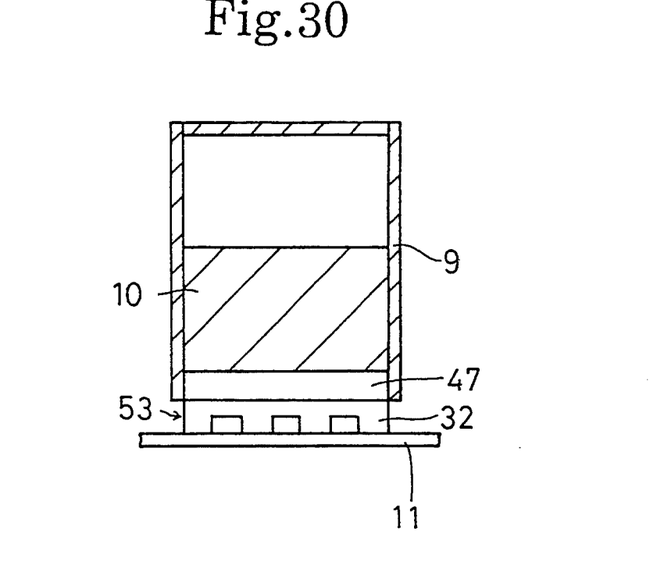
FIG. 30 is a sectional view showing a stamp plate set in a stamp plate holding unit.

The stamp plate 53 is set in a stamp plate holding unit 9 as shown in FIG. 30 and ink 10 is put in the stamp plate holding unit 9. Ink 10 infiltrates into the continuous capillary structure formed in the printing parts 32 of the stamp plate 53. If the printing parts 32 of the stamp plate 53 are overlapped with a printing medium 11 and pressurized, ink infiltrated into the printing parts 32 is transferred onto the printing medium 11.

Using a sheet for forming a photosensitive printing member 50 of the fourth embodiment, a porous stamp plate can be formed with fewer proces steps than the conventional method and without using a mold. As a result, a small number of photosensitive printing members can be used to produce various models of stamps. Moreover, since the protection layer 46 is formed on the photosensitive layer 5, the surface of the photosensitive layer 5 is not damaged when the sheet 50 is in use or not in use.

The supporting member 42 can be removed from the photosensitive layer 5 before exposure and the original 6 can be overlapped with the photosensitive layer 5 and exposed after the removal of the supporting member 42. A thin layer of materials of poor wettability such as silicone resin or fluororesin can be formed on one side or both sides of the supporting member 42.

Photo-softening materials which increase the solubility of the exposed parts can be used instead of the photo-hardening materials. Examples of photo-softening materials are 3-oxyamino-1-butanone-methacrylate, poly-4'-alkyl acylophenon, polymethyl methacrylate, methyl methacrylate, 3-methacryloxyimino-2-butanone copolymer, copolymer of methyl methacrylate and indanone, polyglutarimide, polyolofine sulfone, polymethyl isopropenyl ketone, polymethyl vinyl ketone, polyvinyl phenyl ketone, polysulfone and copolymer of ethylene and carbon monoxide.

It is to be understood that the present invention is not restricted to the foregoing preferred embodiments. Various modifications and alternations can be made thereto without departing from the scope of the invention encompassed by the appended claims.

What is claimed is

1. A photosensitive printing member comprising:
   a supporting member; and
   a photosensitive layer provided on said supporting member, said photosensitive layer comprising a foaming material melted or dispersed in a photosensitive material, the ratio by weight of the photosensitive material to foaming material in the photosensitive layer being from about 1000:1 to about 10:1, wherein upon exposure to light said foaming material generates gas and said photosensitive material becomes hardened so as to form hardened, ink-receptive capillary structures in said photosensitive layer.

2. The photosensitive printing member of claim 1, wherein the photosensitive material is selected from the group consisting of light dimerization resins, light decomposition resins, and photopolymerizable resins.

3. The photosensitive printing member of claim 1, wherein the foaming material is selected from the group consisting of diazonium compounds, azide compounds, diazide compounds, and dicarboxylic acids.

4. The photosensitive printing member of claim 1, wherein the supporting member is a porous supporting member.

5. The photosensitive printing member of claim 1, further comprising a protection layer formed over the photosensitive layer.

6. A stamp plate comprising the photosensitive printing member of claim 1.

7. A photosensitive printing member comprising:
   a porous supporting member having ink-receptive minute holes of a capillary shape; and
   a photosensitive layer provided on said supporting member, said photosensitive layer comprising a foaming material melted or dispersed in a photosensitive material, the ratio by weight of the photosensitive material to foaming material in the photosensitive layer being from about 1000:1 to about 10:1, wherein upon exposure to heat said foaming material generates gas and upon exposure to light said photosensitive material becomes hardened so as to form hardened, ink-receptive capillary structures in said photosensitive layer, whereby ink is capable of infiltrating through said ink-receptive minute holes of said porous supporting member into said hardened, ink-receptive capillary structures in said photosensitive layer.

8. The photosensitive printing member of claim 7, wherein the foaming material is selected from the group consisting of nitroso compounds, sulfohydrazide compounds, hydrazo compounds and azo compounds.

9. A photosensitive printing member comprising:
   a porous supporting member having ink-receptive minute holes of a capillary shape;
   a photosensitive layer provided on said supporting member, said photosensitive layer comprising filler particles dispersed in a photosensitive material, the ratio by weight of photosensitive material to filler particles in the photosensitive layer being from about 1:100 to about 1:1, wherein upon exposure to light said photosensitive material hardens so as to form hardened, ink-receptive capillary structures in said photosensitive layer, said hardened, ink-receptive capillary structures comprising filler particles joined together by said hardened photosensitive material, whereby ink is capable of infiltrating through said ink-receptive minute holes of said porous supporting member into said hardened, ink-receptive capillary structures in said photosensitive layer.

10. The photosensitive printing member of claim 9, wherein the photosensitive material is selected from the group consisting of light dimerization resins, light decomposition resins, and photopolymerizable resins.

11. The photosensitive printing member of claim 9, wherein the filler comprises an inorganic compound selected from the group consisting of metals, metal oxides, metal nitrides, and metal carbides.

12. The photosensitive printing member of claim 9, wherein the filler comprises an organic compound selected from the group consisting of polymers and waxes.

13. A stamp plate comprising the photosensitive printing member of claim 9.

* * * * *